US010875236B2

(12) United States Patent
Posseme et al.

(10) Patent No.: US 10,875,236 B2
(45) Date of Patent: Dec. 29, 2020

(54) METHOD FOR SELECTIVE ETCHING OF A BLOCK COPOLYMER

(71) Applicant: COMMISSARIAT A L'ENERGIE ATOMIQUE ET AUX ENERGIES ALTERNATIVES, Paris (FR)

(72) Inventors: Nicolas Posseme, Sassenage (FR); Sébastien Barnola, Villard-Bonnot (FR); Patricia Pimenta Barros, Grenoble (FR); Aurélien Sarrazin, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 321 days.

(21) Appl. No.: 15/759,086

(22) PCT Filed: Sep. 9, 2016

(86) PCT No.: PCT/EP2016/071267
§ 371 (c)(1),
(2) Date: Mar. 9, 2018

(87) PCT Pub. No.: WO2017/042312
PCT Pub. Date: Mar. 16, 2017

(65) Prior Publication Data
US 2019/0047208 A1 Feb. 14, 2019

(30) Foreign Application Priority Data
Sep. 11, 2015 (FR) ...................................... 15 58481

(51) Int. Cl.
*B29C 59/14* (2006.01)
*G03F 7/00* (2006.01)
(Continued)

(52) U.S. Cl.
CPC .......... *B29C 59/142* (2013.01); *B29C 59/005* (2013.01); *G03F 7/0002* (2013.01);
(Continued)

(58) Field of Classification Search
CPC ................ B29C 59/142; B29C 59/005; B29C 2791/005; B29C 2791/001; G03F 7/0002;
(Continued)

(56) References Cited

U.S. PATENT DOCUMENTS 6,565,763 B1    5/2003  Asakawa et al.
2011/0147337 A1  6/2011  Lee
(Continued)

FOREIGN PATENT DOCUMENTS

EP       2 717 296 A1   4/2014
EP       2 733 533 A2   5/2014
WO  WO 2015/034600 A1   3/2015

OTHER PUBLICATIONS

Farrell et al "Monitoring PMMA Elimination by Reactive Ion Etching from a Lamellar PS-b-PMMA Thin Film by ex Situ TEM Methods". Macromolecules 2010, 43, 20, 8651-8655. Oct. 4, 2010 (Year: 2010).*

(Continued)

*Primary Examiner* — Matthew J Daniels
*Assistant Examiner* — Gregory Chad Grosso
(74) *Attorney, Agent, or Firm* — Pillsbury Winthrop Shaw Pittman LLP

(57) ABSTRACT

A method for etching a layer of assembled block copolymer including first and second polymer phases, the etching method including a first step of etching by a first plasma formed from carbon monoxide or a first gas mixture including a fluorocarbon gas and a depolymerising gas, the first etching step being carried out so as to partially etch the first polymer phase and to deposit a carbon layer on the second (Continued)

polymer phase, and a second step of etching by a second plasma formed from a second gas mixture including a depolymerising gas and a gas selected among the carbon oxides and the fluorocarbon gases, the second etching step being carried out so as to etch the first polymer phase and the carbon layer on the second polymer phase.

12 Claims, 2 Drawing Sheets

(51) Int. Cl.
    *B29C 59/00*     (2006.01)
    *H01L 21/02*     (2006.01)
    *H01L 21/768*     (2006.01)
    *C08F 8/50*     (2006.01)
    *C08F 299/02*     (2006.01)
    *C08L 25/08*     (2006.01)
    *C08L 33/12*     (2006.01)

(52) U.S. Cl.
    CPC .. *H01L 21/02527* (2013.01); *H01L 21/76856* (2013.01); *B29C 2791/001* (2013.01); *B29C 2791/005* (2013.01); *C08F 8/50* (2013.01); *C08F 299/024* (2013.01); *C08L 25/08* (2013.01); *C08L 33/12* (2013.01)

(58) Field of Classification Search
    CPC ....... H01L 21/02527; H01L 221/76856; H01L 21/0271; H01L 21/3065–3088; H01L 21/31138–31144; H01L 21/32139; H01L 21/467; H01L 21/47; H01L 21/47573; C08F 8/50; C08F 299/024; C08L 25/08; C08L 33/12; B81C 1/00031; B81C 1/00388–00428; B81C 1/00531; B81C 1/00595; B81C 1/00626; B81C 2201/0112; B81C 2201/0132; B81C 2201/0142; B81C 2201/0149

USPC ....... 264/483; 216/41, 49, 67; 438/694, 700, 438/702, 710, 735, 738, 947

See application file for complete search history.

(56) References Cited

U.S. PATENT DOCUMENTS

| | | |
|---|---|---|
| 2012/0127454 A1 | 5/2012 | Nakamura et al. |
| 2014/0091435 A1* | 4/2014 | Chan ................. H01L 21/31138 257/618 |
| 2015/0170926 A1* | 6/2015 | Michalak ............ H01L 23/5329 257/734 |
| 2015/0225601 A1 | 8/2015 | Komatsu et al. |

OTHER PUBLICATIONS

International Search Report as issued in International Patent Application No. PCT/EP2016/071267, dated Oct. 26, 2016.
Search Report as issued in French Patent Application No. 1558481, dated Aug. 16, 2016.
Barnola, S., et al., "Plasma etching & integration challenges using alternative patterning techniques for 11nm node & beyond," Proc. of SPIE, vol. 9054, 2014, 12 pages.
Chan, B. T., et al., "28 nm pitch of line/space pattern transfer into silicon substrates with chemo-epitaxy Directed Self-Assembly (DSA) process flow," Microelectronic Engineering, vol. 123, 2014, pp. 180-186.
Omura, M., et al., "Highly sensitive etch gas chemistry design for precise DSAL dry development process," Proc. of SPIE, vol. 9054, 2014, 7 pages.
Pimenta Barros, P., et al., "Etch challenges for DSA implementation in CMOS via patterning," Proc. of SPIE vol. 9054, 2014, 10 pages.
Yamamoto, H., et al., "Selective etch of poly(methyl methacrylate) in block copolymer based on control of ion energy and design of gas chemistry for directed self assembly lithography," Japanese Journal of Applied Physics, vol. 53, 2014, pp. 03DD03-1-03DD03-4.

* cited by examiner

METHOD FOR SELECTIVE ETCHING OF A BLOCK COPOLYMER

CROSS-REFERENCE TO RELATED APPLICATIONS

This is the U.S. National Stage of PCT/EP2016/071267, filed Sep. 9, 2016, which in turn claims priority to French Application No. 1558481, filed Sep. 11, 2015, the entire contents of all applications are incorporated herein by reference in their entireties.

TECHNICAL FIELD

The present invention relates to techniques of block copolymers directed self-assembly (DSA) allowing patterns of very high resolution and density to be generated. More specifically, the invention relates to an etching method making it possible to remove a first phase of a block copolymer selectively with respect to a second phase of the block copolymer.

PRIOR ART

The resolution limit of optical lithography leads to novel techniques being explored to produce patterns of which the critical dimension (CD) is less than 22 nm. Directed self-assembly of block copolymers is considered as one of the most promising emerging lithography techniques, due to its simplicity and the low cost of its implementation.

Block copolymers are polymers in which two repeating units, a monomer A and a monomer B, form chains bound together by a covalent bond. When sufficient mobility is given to the chains, for example by heating these block copolymers, the chains of monomer A and the chains of monomer B have a tendency to separate into phases or blocks of polymer and to reorganise into specific conformations, which notably depend on the ratio between the monomer A and the monomer B. Depending on this ratio, it is possible to have spheres of A in a matrix of B, or instead cylinders of A in a matrix of B, or instead intercalated lamellas of A and lamellas of B. The size of the domains of block A (respectively block B) is directly proportional to the length of the chains of monomer A (respectively monomer B). Block copolymers thus have the property of forming polymer patterns which may be controlled thanks to the ratio of the monomers A and B.

Known block copolymer directed self-assembly (DSA) techniques may be grouped together into two categories, grapho-epitaxy and chemo-epitaxy.

Grapho-epitaxy consists in forming primary patterns called guides on the surface of a substrate, these patterns delimiting areas inside which a block copolymer layer is deposited. The guiding patterns make it possible to control the organisation of the blocks of copolymer to form secondary patterns of greater resolution inside these areas. The guiding patterns are conventionally formed by photolithography in a resin layer.

In DSA techniques using chemo-epitaxy, the substrate undergoes a chemical modification of its surface in such a way as to create zones preferentially attracting a single block of the copolymer, or neutral zones not attracting either of the two blocks of the copolymer. Thus, the block copolymer is not organised in a random manner, but according to the chemical contrast of the substrate. The chemical modification of the substrate may notably be obtained by grafting of a neutralisation layer called "brush layer", for example formed of a random copolymer.

DSA techniques make it possible to produce different types of patterns in an integrated circuit substrate. After deposition and assembly of the block copolymer on the substrate, secondary patterns are developed by removing one of the two blocks of the copolymer, for example block A, selectively with respect to the other, thereby forming patterns in the remaining copolymer layer (block B). If the domains of block A are cylinders, the patterns obtained after removal are cylindrical holes. On the other hand, if the domains of block A are lamellas, rectilinear trench-shaped patterns are obtained. Then, these patterns are transferred by etching on the surface of the substrate, either directly in a dielectric layer, or beforehand in a hard mask covering the dielectric layer.

The block copolymer PMMA-b-PS, constituted of polymethylmethacrylate (PMMA) and polystyrene (PS), is the most studied in the literature. Indeed, the syntheses of this block copolymer and the corresponding random copolymer (PMMA-r-PS) are easy to carry out and perfectly mastered. The removal of the PMMA phase may be carried out by wet etching, optionally coupled with exposure to ultraviolet rays, or by dry etching using a plasma.

Wet etching of PMMA, for example in an acetic acid bath, is a highly selective removal technique with respect to polystyrene. The selectivity, that is to say the ratio of the etching rate of PMMA over the etching rate of polystyrene, is high (greater than 20:1). However, with this technique, etching residues are redeposited on the etched copolymer layer, blocking part of the patterns obtained in the polystyrene layer which prevents their transfer. Moreover, in the case of lamella-shaped domains, wet etching may cause a collapse of the polystyrene structures due to considerable capillarity forces.

Dry plasma etching does not suffer from these drawbacks and has considerable economic interest, because the step of transferring the patterns that follows the step of removing the PMMA is also a plasma etching. Consequently, the same equipment may be used successively for these two steps. The plasmas normally used to etch the PMMA phase are generated from a mixture of argon and oxygen ($Ar/O_2$) or a mixture of oxygen and fluorocarbon gas (e.g. $O_2/CHF_3$). The etching of PMMA using these plasmas is however carried out with a selectivity with respect to polystyrene much lower than that of wet etching (respectively 4.2 and 3.5).

Thus, other plasmas have been developed in order to increase the selectivity of the (dry) etching of PMMA. For example, in the article ["Highly selective etch gas chemistry design for precise DSAL dry development process", M. Omura et al., Advanced Etch Technology for Nanopatterning III, Proc. SPIE Vol. 9054, 905409, 2014], the authors show that a plasma of carbon monoxide (CO) makes it possible to etch PMMA with practically infinite selectivity. Indeed, the PMMA is etched by the CO plasma without the polystyrene being impacted, because a carbon deposit simultaneously forms on the polystyrene.

FIG. 1 is a graph that represents the etching depth in a PMMA layer and in a polystyrene (PS) layer during etching by CO plasma. It illustrates the difference in regimes between the two layers: etching regime in the case of the PMMA layer (positive etching depth) and deposition regime in the case of the PS layer (negative etching depth).

When this gas is used alone, a phenomenon of saturation takes place at around 30 s of etching, leading to stoppage of the PMMA etching. Indeed, the deposition regime progressively takes dominance over the etching regime and the PMMA etching is stopped at an etching depth of around 15 nm by the formation of a carbon layer on the partially etched layer of PMMA. It is thus not possible to etch more than 15 nm thickness of PMMA with this single gas.

To overcome this problem of saturation, carbon monoxide is mixed with hydrogen ($H_2$) at a concentration less than or equal to 7% and the plasma is generated at a polarisation power of around 80 W. In practice, it is observed that this gas mixture has an etching selectivity much lower than that of carbon monoxide alone, because the addition of hydrogen inhibits the deposition of the carbon layer on the polystyrene. The polystyrene is then etched at the same time as the PMMA. The result is a widening of the patterns formed in the polystyrene layer (compared to the initial dimensions of the domains of PMMA) and difficulties in transferring these patterns into the substrate. Indeed, the polystyrene layer used as mask during this transfer risks not being sufficiently thick.

SUMMARY OF THE INVENTION

The aim of the present invention is to push back the limits of dry etching of a block copolymer in terms of etching depth, while having high etching selectivity between the phases or blocks of the copolymer.

According to the invention, this objective tends to be achieved by providing a method for etching an assembled block copolymer layer comprising first and second polymer phases, the etching method comprising:

a first step of etching by a first plasma formed from carbon monoxide or a first gas mixture comprising a fluorocarbon gas and a depolymerising gas, the first etching step being carried out so as to partially etch the first polymer phase and to deposit a carbon layer on the second polymer phase; and a second step of etching by a second plasma formed from a second gas mixture comprising a depolymerising gas and a gas selected among the carbon oxides and the fluorocarbon gases, the second etching step being carried out so as to etch the first polymer phase and the carbon layer on the second polymer phase.

The method according to the invention thereby combines a first etching step, the selectivity of which is practically infinite but which is limited in terms of depth of etching of the first polymer phase, with a second etching step which is less selective but makes it possible to further etch the first polymer phase. The carbon layer formed on the second polymer phase during the first etching step protects the second phase during the second etching step. The carbon layer serves as sacrificial layer, because it is consumed during the second etching step instead of the second polymer phase. In this way it is possible to be free of the phenomenon of saturation of carbon based plasmas while preserving high etching selectivity.

This sequence of steps advantageously constitutes an etching cycle, which may be reproduced several times according to the thickness of the first polymer phase to be etched. The etching method does not then experience any limit in terms of etching depth.

In a preferential embodiment of the method according to the invention, the first plasma and the second plasma are formed using a same etching gas other than the depolymerising gas. The etching method is then particularly simple to carry out.

This etching gas may be carbon monoxide. It is then used alone during the first etching step and in combination with a depolymerising gas during the second etching step.

This etching gas may also be selected among the fluorocarbon gases. It is then mixed with a depolymerising gas during each of the first and second etching steps. The first etching step advantageously has a ratio of the flow rate of fluorocarbon gas over the flow rate of depolymerising gas comprised between 0.8 and 1.2 and the second etching step advantageously has a ratio of the flow rate of fluorocarbon gas over the flow rate of depolymerising gas comprised between 0.3 and 0.7.

The method according to the invention may also have one or more of the characteristics below, considered individually or according to all technically possible combinations thereof:

the second etching step has a ratio of the flow rate of carbon oxide over the flow rate of depolymerising gas comprised between 0.3 and 50;

the first etching step is carried out in conditions such that the carbon layer is only deposited on the second polymer phase;

the first etching step has a duration comprised between 5 s and 30 s, the first etching step is carried out in conditions such that the carbon layer is further deposited on the first partially etched polymer phase, the carbon layer having a thickness on the first polymer phase lower than on the second polymer phase;

the second etching step has a duration comprised between 5 s and 30 s, the first polymer phase is organic and has a concentration of oxygen atoms greater than 20%;

the second polymer phase has a concentration of oxygen atoms less than 10%, and the depolymerising gas of the first mixture and the depolymerising gas of the second mixture are selected from $H_2$, $N_2$, $O_2$, Xe, Ar and He.

BRIEF DESCRIPTION OF THE FIGURES

Other characteristics and advantages of the invention will become clear from the description that is given thereof below, for indicative purposes and in no way limiting, with reference to the appended figures, among which.

For greater clarity, identical or similar elements are marked by identical reference signs in all of the figures.

DETAILED DESCRIPTION OF AT LEAST ONE EMBODIMENT

Figure 2:
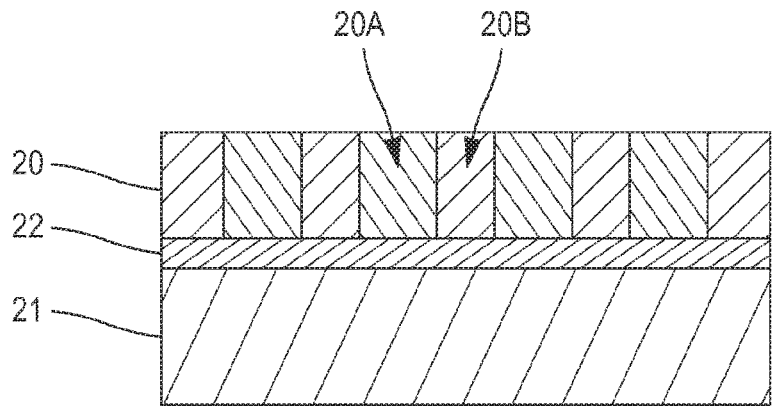
FIG. 2 represents an example of an assembled block copolymer layer before the execution of the etching method according to the invention.

FIG. 2 shows a layer 20 of assembled block copolymer before it is etched thanks to the etching method according to the invention. The copolymer layer 20 comprises first and second polymer phases, noted respectively 20A and 20B, which are organised into domains. The copolymer of the layer 20 is for example the di-block copolymer PS-b-PMMA, that is to say a copolymer constituted of polymethylmethacrylate (PMMA) and polystyrene (PS). The polymer phase 20A here corresponds to PMMA and the polymer phase 20B to polystyrene.

One way to obtain this block copolymer layer 20 consists in depositing the block copolymer PS-b-PMMA on a substrate 21 covered with a neutralisation layer 22. The neutralisation layer 22 enables the separation of the phases 20A-20B during the step of assembly of the block copolymer, in other words the organisation of the domains of the copolymer. It is for example formed of a layer of random copolymer PS-r-PMMA. Preferably, the domains of PMMA (phase 20A) are oriented perpendicularly to the substrate 21 and extend over the whole thickness of the copolymer layer 20. Depending on the ratio between PMMA and polystyrene in the copolymer PS-b-PMMA, the domains of PMMA may be cylinder-shaped (then referred to as cylindrical block copolymer) or lamella-shaped (lamellar block copolymer).

The plasma etching method described hereafter aims to etch the copolymer phase containing the most oxygen atoms, the PMMA phase 20A in the above example, selectively with respect to the other phase, the polystyrene phase 20B. To this end, it comprises two successive etching steps which together form an etching cycle. A single etching cycle (i.e. a single iteration of each of the etching steps) may not suffice to entirely etch the PMMA phase 20A if the thickness of the copolymer layer 20 is too high. In this case, the etching method advantageously comprises several successive etching cycles, each cycle allowing a portion of the PMMA phase to be remove and comprising the two etching steps.

Figure 3A:
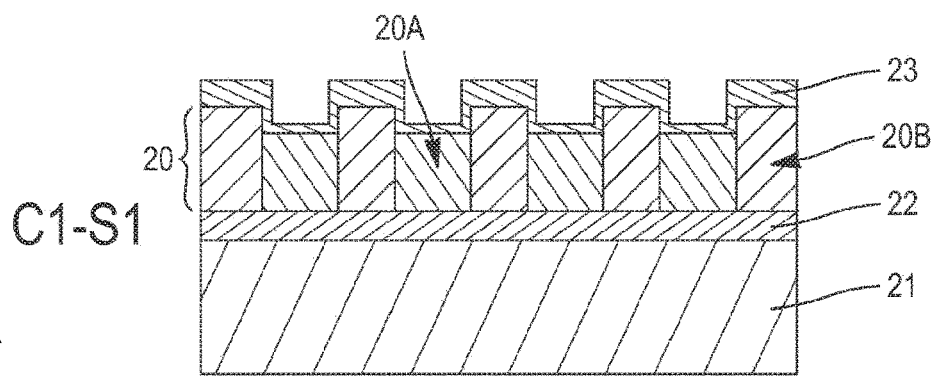
FIGS. 3A to 3D represent the evolution of the copolymer layer of FIG. 2 during two successive etching cycles of the etching method according to the invention.
Figure 3B:
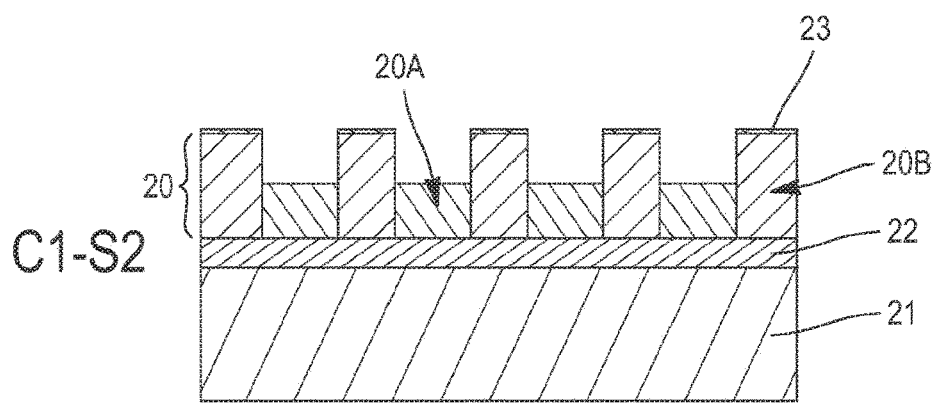

FIGS. 3A and 3B represent the evolution of the copolymer layer 20 during a first etching cycle C1. This cycle C1 comprises a first plasma etching step S1, during which the PMMA phase 20A is partially etched and the polystyrene phase 20B is covered with a carbon layer 23 (FIG. 3A). It further comprises a second etching step S2, also by plasma, making it possible to etch simultaneously the PMMA phase 20A and the carbon layer 23 obtained previously (FIG. 3B). The plasmas of the etching steps S1-S2 may be formed in a CCP (Capacitively Coupled Plasma) or an ICP (Inductively Coupled Plasma) reactor.

The conditions in which the first etching step S1 is carried out may be selected such that the carbon layer 23 covers the PMMA phase 20A in addition to the polystyrene phase 20B, as is illustrated in FIG. 3A. The carbon layer 23 obtained has however a thickness on the PMMA phase 20A less than that on the polystyrene phase 20B, without which it would no longer be possible to etch the PMMA without impacting the polystyrene during the second etching step S2.

As indicated in the article ["Highly selective etch gas chemistry design for precise DSAL dry development process", M. Omura et al., Advanced Etch Technology for Nanopatterning III, Proc. SPIE Vol. 9054, 905409, 2014], a plasma of carbon monoxide (CO) makes it possible to carry out simultaneously a partial etching of PMMA and a carbon deposition on polystyrene. The ions of this gas destroy the chains of the PMMA polymer by consuming the oxygen that they contain. They are also behind the formation of the carbon layer 23 on the polystyrene, the latter being insensitive to the etching because it does not contain oxygen.

CO plasma may thus be used during the first etching step S1. The flow rate of carbon monoxide entering the chamber of the reactor is preferably comprised between 100 sccm and 500 sccm (abbreviation for "Standard Cubic Centimetre per Minute", i.e. the number of $cm^3$ of gas flowing per minute in standard conditions of pressure and temperature, i.e. at a temperature of 0° C. and a pressure of 1013.25 hPa).

Alternatively, the plasma of the first step S1 may be generated from a gas mixture comprising one or more fluorocarbon gases ($C_xF_y$), optionally hydrogenated ($C_xF_yH$) or iodated ($C_xF_yI$), and a depolymerising gas, for example selected among $H_2$, $N_2$, $O_2$, Xe, Ar, He, etc. The role of the depolymerising gas is to control the quantity of polymers forming during the reaction between the species coming from the etching gas and the material to etch. Without this gas, a fluorocarbon deposit would be deposited in a significant manner on the two blocks of the copolymer. The flow rate of fluorocarbon gas and the flow rate of depolymerising gas during this first etching step S1 are preferably comprised between 10 sccm and 200 sccm. The ratio of the flow rate of fluorocarbon gas over the flow rate of depolymerising gas is advantageously comprised between 0.8 and 1.2, for example 1.

The other parameters of the etching plasma during the first step S1 are advantageously the following, whatever the nature of the etching gas used (CO or $C_xF_y$):
- a power (RF) emitted by the source of the reactor comprised between 50 W and 500 W;
- a polarisation power (DC or RF) of the substrate comprised between 50 W and 500 W,
- a pressure in the chamber of the reactor comprised between 2.67 Pa (20 mTorr) and 16.00 Pa (120 mTorr).

Figure 1:
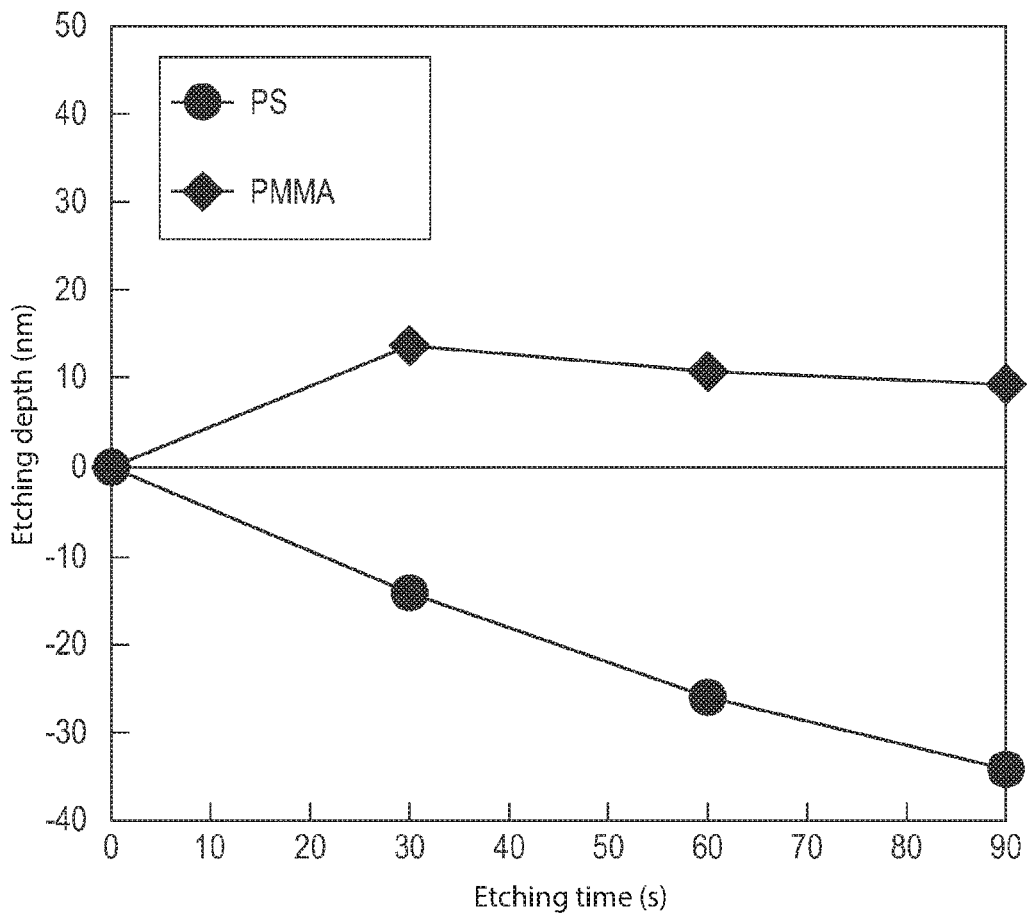
FIG. 1, described previously, represents the etching depth in a PMMA layer and in a polystyrene (PS) layer during etching by a carbon monoxide plasma.

In an alternative embodiment of the first step S1 (not represented), the etching conditions are such that the carbon layer 23 only covers the polystyrene phase 20B. In the aforesaid power and pressure ranges, this may be obtained by playing on the etching time. Preferably, the duration of the first etching step S1 is comprised between 5 s and 30 s. Thus, the PMMA phase 20A is partially etched without the carbon layer 23 being formed on its surface. In other words, in the graph of FIG. 1, this takes place before the etching saturation threshold, where the PMMA etching regime predominates. This embodiment of the etching step S1 is the quickest and the most economical in gas.

As an example, a plasma generated in a CCP reactor from carbon monoxide (CO), with a flow rate of 250 sccm, a source power of 150 W, a polarisation power of 50 W and a pressure of 16.00 Pa (120 mTorr) makes it possible to etch around 13 nm of PMMA in 10 s and to deposit during the same time lapse a carbon layer of around 1 nm on the polystyrene.

A substantially identical result may be obtained by mixing in the same type of reactor perfluorocyclobutane ($C_4F_8$) and nitrogen ($N_2$), both with a flow rate of 25 sccm, and by applying a source power of 300 W and a polarisation power of 60 W under a pressure of 4.00 Pa (30 mTorr) for 20 s. Indeed, a portion of PMMA of around 10 nm thickness is removed while a carbon layer of 1 nm thickness is deposited on the polystyrene.

The second etching step S2, represented in FIG. 3B, makes it possible to continue the etching of the PMMA phase 20A using a more aggressive chemistry with respect to PMMA, but less selective with respect to the polystyrene phase 20B. This second step S2 thus makes it possible to exceed the limits of the first step S1 in terms of etching depth. The fact that the PMMA/PS selectivity of the second etching step S2 is low is without incidence, because the polystyrene phase 20B is protected by the carbon layer 23.

The etching gas making it possible to generate the plasma of the second etching step S2 is selected among the carbon oxides ($CO_x$), for example CO or $CO_2$, and the fluorocarbon gases ($C_xF_y$, $C_xF_yH$ or $C_xF_yI$). Its flow rate at the inlet of the reactor (ICP or CCP) is advantageously comprised between 10 sccm and 500 sccm. In the chamber of the reactor, it is mixed with a depolymerising gas ($H_2$, $N_2$, $O_2$, Xe, Ar, He, etc.) in order to control the level of polymerisation of the material.

The selectivity of these chemistries with respect to the carbon layer 23 deposited during the first step S1 is high, of the order of 25. In order to fulfil its protective role, the carbon layer 23 may thus be as thin as 1 nm thickness.

The etching step S2 is stopped at the latest when the polystyrene phase 20B is exposed, that is to say when the carbon layer 23 is entirely etched. Its duration is preferably comprised between 5 s and 30 s. The pressure in the chamber of the reactor during step S2 is advantageously comprised between 2.67 Pa (20 mTorr) and 16.00 Pa (120 mTorr). The source and polarisation powers may be the same as during step S1 (50-500 W).

As an example, the plasma of step S2 is generated in a CCP reactor by mixing carbon monoxide (CO) and hydrogen ($H_2$), both with a flow rate of 250 sccm, and by applying a source power of 150 W and a polarisation power of 50 W under a pressure of 16.00 Pa (120 mTorr) for 20 s. A new portion of PMMA of around 25 nm thickness is thereby removed. The carbon layer of 1 nm thickness obtained at step S1 is entirely consumed, without however the polystyrene being etched.

The depolymerising gas used in the second step S2 may be different to that (optionally) used in the first step S1, in combination with the fluorocarbon gas. However, in the interests of simplification of the etching method, the same depolymerising gas is advantageously used during both steps.

For the same reasons, the etching gas used at the first step S1 is in a preferential embodiment of the etching method the same as that used in the second step S2. Thus, when carbon monoxide is employed (alone) in step S1, it forms part of the gas mixture used in step S2. The ratio of the flow rate of carbon monoxide over the flow rate of depolymerising gas during the second step S2 is advantageously comprised between 0.3 and 50. In the same way, if the choice of the etching gas for the first step S1 concerns a fluorocarbon gas, it may be maintained for the second step S2. The difference in behaviour of the plasmas with respect to the carbon layer 23 between the two steps S1-S2 (i.e. deposition then etching) is then due to different gas ratios between the two mixtures. During the second etching step S2, the ratio of the flow rate of fluorocarbon gas over the flow rate of depolymerising gas is advantageously comprised between 0.3 and 0.7 (0.8-1.2 during the first step S1).

Since the etching steps S1-S2 are independent of each other, nothing prevents them being carried out with etching gases belonging to different families (carbon monoxide on the one hand and fluorocarbon gas on the other hand), or by selecting gases of different natures in a same family (for example $C_4F_6$ on the one hand and $C_4F_8$ on the other hand). Various combinations of gases are thereby possible between steps S1 and S2 of the method.

At the end of the etching cycle C1, the PMMA phase 20A has been etched over a greater thickness than if it had been etched with the method of the prior art, that is to say during a single etching step with CO plasma. When a portion of the PMMA phase 20A remains at the end of the first etching cycle C1, as is illustrated in FIG. 3B, the method comprises at least one new etching cycle comprising the steps S1 and S2. The etching parameters of steps S1 and S2 are advantageously the same from one etching cycle to the next.

Figure 3C:
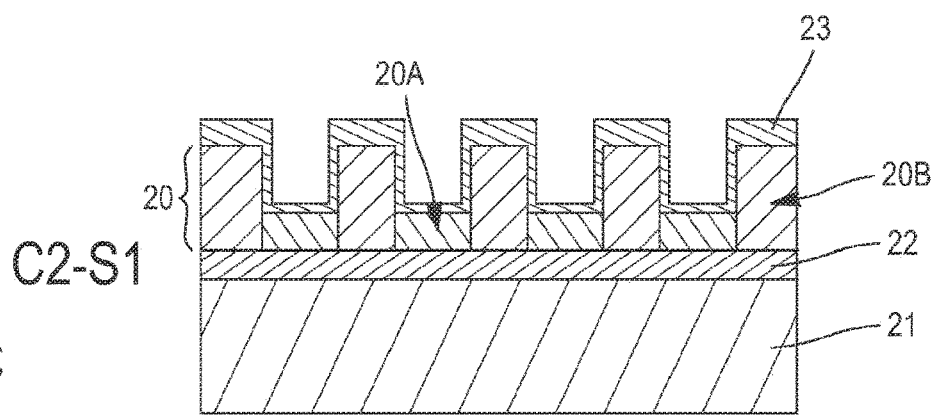
Figure 3D:
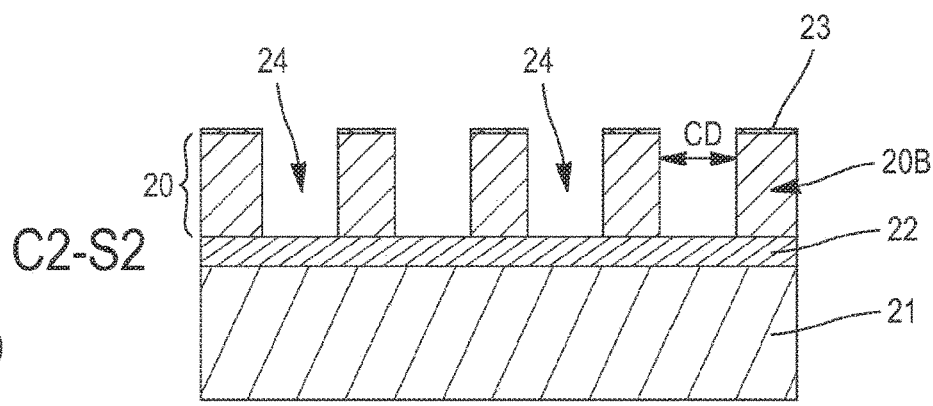

FIGS. 3C and 3D represent respectively the steps S1 and S2 of a second etching cycle C2 initiated immediately after the end of the first etching cycle C1. At step S1 (FIG. 3C), the carbon layer 23 is once again formed on the polystyrene phase 20B (and optionally on the remaining PMMA phase 20A), before being consumed during step S2. During each of the steps S1-S2 of the cycle C2, the PMMA phase 20A is once again etched.

In the example of FIGS. 3A-3D, two etching cycles C1-C2 suffice to entirely etch the PMMA phase 20A of the block copolymer layer 20. Patterns 24 are then apparent in the remaining copolymer layer, henceforth composed uniquely of the polystyrene phase 20B (FIG. 3D). The polystyrene phase 20B is practically not etched during this etching method. Various tests have been carried out and show that the PMMA phase of a PS-b-PMMA copolymer layer of 50 nm thickness may be etched in two successive cycles C1-C2 while consuming less than 1 nm of polystyrene. The PMMA/PS selectivity of the etching method, averaged over the two steps S1 and S2, is thus around 50.

It is preferable, during the second etching step S2 of each cycle, not to entirely etch the carbon layer 23 (cf. FIGS. 3B, 3D), because the polystyrene phase 20B may be etched in a superficial manner during the first seconds of step S1 of the following cycle, i.e. the time that the carbon layer 23 forms. The carbon layer 23 may subsist even after the second step S2 of the final etching cycle. It then reinforces the polystyrene layer that will serve as mask for the transfer of the patterns 24 into the substrate 21 (after opening of the neutralisation layer 22).

Since the deposition rate and the etching rate of the carbon layer 23 (respectively during the first etching step S1 and the second etching step S2) may be determined easily, and optionally adjusted by playing on the parameters of each etching, it is possible to control the thickness of the carbon layer 23, notably on the sides of the patterns 24 obtained by the etching of the PMMA phase 20A. The etching method of FIGS. 3A-3D thereby ensures better control of the critical dimension CD of the patterns 24 (cf. FIG. 3D). Critical dimension is taken to mean the smallest dimension of the patterns 24 obtained by the development of the block copolymer.

Although it has been described taking the copolymer PS-b-PMMA as example, the etching method according to the invention is applicable to all block copolymers comprising a first organic polymer phase (20A) rich in oxygen, that is to say having to a concentration of oxygen atoms greater than 20%, and a second polymer phase (organic or inorganic) poor in oxygen, i.e. having a concentration of oxygen atoms less than 10%. This is the case notably of the di-block copolymers PS-b-PLA, PDMS-b-PMMA, PDMS-b-PLA, PDMSB-b-PLA, etc. The block copolymer may be either of cylindrical type, or of lamellar type.

Finally, the organised block copolymer layer may obviously be obtained in a different manner to that described above in relation with FIG. 2, notably by grapho-epitaxy, by chemo-epitaxy using a neutralisation layer other than a random copolymer (for example a self-assembled monolayer, SAM), or by a hybrid technique combining graphoepitaxy and chemo-epitaxy.

The invention claimed is:

1. A method for etching an assembled block copolymer layer comprising first and second polymer phases, the etching method comprising:
    a first step of etching by a first plasma formed from carbon monoxide or a first gas mixture comprising a fluorocarbon gas and a depolymerising gas, the first etching step being carried out so as to partially etch the first polymer phase and to deposit a carbon layer on the second polymer phase, and
    a second step of etching by a second plasma formed from a second gas mixture comprising a depolymerising gas and a gas selected among the carbon oxides and the fluorocarbon gases, the second etching step being carried out so as to etch the first polymer phase and the carbon layer on the second polymer phase.

2. The method according to claim 1, comprising a plurality of successive etching cycles, each etching cycle successively comprising the first etching step and the second etching step.

3. The method according to claim 1, wherein the first plasma and the second plasma are formed using a same gas other than the depolymerising gas.

4. The method according to claim 3, wherein the second mixture comprises carbon monoxide.

5. The method according to claim 3, wherein the first etching step has a ratio of the flow rate of fluorocarbon gas over the flow rate of depolymerising gas comprised between 0.8 and 1.2 and wherein the second etching step has a ratio of the flow rate of fluorocarbon gas over the flow rate of depolymerising gas comprised between 0.3 and 0.7.

6. The method according to claim 1, wherein the second etching step has a ratio of the flow rate of carbon oxide over the flow rate of depolymerising gas comprised between 0.3 and 50.

7. The method according to claim 1, wherein the first etching step is carried out in conditions such that the carbon layer is only deposited on the second polymer phase.

8. The method according to claim 7, wherein the first etching step has a duration comprised between 5 s and 30 s.

9. The method according to claim 1, wherein the first etching step is carried out in conditions such that the carbon layer is further deposited on the first partially etched polymer phase, the carbon layer having a thickness on the first polymer phase lower than on the second polymer phase.

10. The method according to claim 1, wherein the second etching step has a duration comprised between 5 s and 30 s.

11. The method according to claim 1, wherein the first polymer phase is PMMA or PLA, and wherein the second polymer phase is PS, PDMS, or PDMSB.

12. The method according to claim 1, wherein the depolymerising gas of the first mixture and the depolymerising gas of the second mixture are selected from $H_2$, $N_2$, $O_2$, Xe, Ar and He.

* * * * *